United States Patent
Emoto et al.

(10) Patent No.: US 9,139,769 B2
(45) Date of Patent: Sep. 22, 2015

(54) BETA-SIALON, METHOD FOR PRODUCING SAME AND LIGHT-EMITTING DEVICE USING SAME

(75) Inventors: Hideyuki Emoto, Machida (JP); Kazuhiro Ito, Machida (JP)

(73) Assignee: DENKI KAGAKU KOGYO KABUSHIKI KAISHA, Tokyo (JP)

( * ) Notice: Subject to any disclaimer, the term of this patent is extended or adjusted under 35 U.S.C. 154(b) by 521 days.

(21) Appl. No.: 13/508,949

(22) PCT Filed: Nov. 4, 2010

(86) PCT No.: PCT/JP2010/069599
§ 371 (c)(1),
(2), (4) Date: May 9, 2012

(87) PCT Pub. No.: WO2011/058919
PCT Pub. Date: May 19, 2011

(65) Prior Publication Data
US 2012/0228551 A1     Sep. 13, 2012

(30) Foreign Application Priority Data
Nov. 10, 2009   (JP) ................................. 2009-256913

(51) Int. Cl.
| | |
|---|---|
| *C09K 11/77* | (2006.01) |
| *C09K 11/08* | (2006.01) |
| *H05B 33/14* | (2006.01) |
| *H01L 33/50* | (2010.01) |

(52) U.S. Cl.
CPC ......... *C09K 11/7734* (2013.01); *C09K 11/0883* (2013.01); *H05B 33/14* (2013.01); *H01L 33/50* (2013.01)

(58) Field of Classification Search
CPC .................................................... C09K 11/7734
USPC .................................................... 252/301.4 F
See application file for complete search history.

(56) References Cited

U.S. PATENT DOCUMENTS

2010/0053932 A1*   3/2010   Emoto et al. .................... 362/84
2010/0219741 A1*   9/2010   Kawasaki et al. ............. 313/483

FOREIGN PATENT DOCUMENTS

| EP | 1884552 A1 | 2/2008 |
|---|---|---|
| EP | 2093272 A1 | 8/2009 |

(Continued)

OTHER PUBLICATIONS

International Search Report filed in international application PCT/JP2010/069599.

(Continued)

*Primary Examiner* — Matthew E Hoban
(74) *Attorney, Agent, or Firm* — Stein IP, LLC (57) ABSTRACT

β-Sialon comprising $Eu^{2+}$ that is present in a solid solution form in β-sialon represented by $Si_{6-z}Al_zO_zN$ μm [wherein z is 0.3-1.5], which shows, when excited with light of 450 nm in wavelength, a peak wavelength of fluorescent spectrum of 545-560 nm, a half-value breadth of 55 nm or greater, and an external quantum efficiency of 45% or greater. The β-sialon can be produced by blending at least one kind of oxide selected from aluminum oxide and silicon oxide with silicon nitride and aluminum nitride in such a manner as to give z of 0.3-1.5, further adding thereto a europium compound and a β-sialon powder having an average particle diameter of 5 μm or greater and an average degree of circularity of 0.7 or greater, each in a definite amount, and baking the mixture.

2 Claims, 4 Drawing Sheets

(56) References Cited

FOREIGN PATENT DOCUMENTS

| JP | 2005-255895 | | 9/2005 |
|----|----|----|----|
| JP | 3921545 | | 3/2007 |
| WO | WO2007/142289 | * | 12/2007 |
| WO | WO2008/062781 | * | 5/2008 |
| WO | WO 2009/017206 | | 2/2009 |

OTHER PUBLICATIONS

Kimoto et al., Direct observation of single dopant atom in light-emitting phosphor of β-SiAlon: $Eu^{2+}$, Applied Physics Letters 94, 041908 (2009).

Ryu et al., Luminescence properties of $Eu^{2+}$-doped $β-Si_{6-z}Al_zO_zN_{8-z}$ microcrystals fabricated by gas pressured reaction, Journal of Crystal Growth (2008).

Xie et al., Synthesis and Photoluminescence Properties of β-sialon: $EU^{2+}$ ($Si_{6-z}O_zN_{8-z}:EU^{2+}$), Journal of the Electrochemical Society, 154 (IO) J314-J319 (2007).

European Search Report for Application No. 10829878.7-2111/2500399 PCT/JP2010069599.

* cited by examiner

BETA-SIALON, METHOD FOR PRODUCING SAME AND LIGHT-EMITTING DEVICE USING SAME

CROSS-REFERENCE TO RELATED APPLICATIONS

This application claims the benefit of PCT International Patent Application No. PCT/JP2010/069599, filed Nov. 4, 2010, and Japanese Patent Application No. 2009-256913, filed Nov. 10, 2009, in the Japan Patent Office, the disclosures of which are incorporated herein by reference.

BACKGROUND OF THE INVENTION

1. Field of the Invention

The present invention relates to phosphor used in combination with light-emitting diode chips that emit blue or ultraviolet light, and more specifically β-Sialon comprising Eu2+ in a form of a solid solution applicable to white LED and various light-emitting devices, its applications, and its producing method. Hereinafter, the light-emitting diode is referred to as LED.

2. Description of the Related Art

With the increase in output of white LED, demands for heat resistance and durability of phosphor used for them are increasing. In particular, as phosphor having little brightness variation due to temperature increase and excellent durability, those using highly covalent nitride and oxynitride as base materials are attracting attentions.

Of nitride and oxynitride phosphor, divalent europium (Eu) ion doped β-Sialon which contains divalent europium (Eu) ions in a form of solid solution, in particular, is coming into practical use as a phosphor useful for white LED because it is excited by light in wide wavelength range from ultraviolet to blue light and emits green light having its peak in the wavelength range from 520 to 545 nm (Patent Literature 1).

In $Eu^{2+}$ doped β-Sialon, aluminum (Al) replaces the position of silicon (Si), and oxygen (O) replaces the position of nitrogen (N), of β-type silicon nitride crystal, as solid solutions, and is given by general formula $Si_{6-z}Al_zO_zN_{8-z}$ (z: 0 to 4.2) because there exist two formula-weight atoms in a unit cell (unit lattice). Eu ions, namely light emission center, do not replace the positions of Si and Al but are present in a form of solid solution by entering channel-shaped gaps that extend in the direction of c-axis of the β-type silicon nitride crystal (Non-patent Literature 1). Luminescence of divalent Eu ions is caused by 4f-5d transition, and emission property depends largely on the environment where Eu ions are present. Consequently, it is possible to adjust the emission property based on the z value, which is a β-Sialon composition parameter, and Eu ion concentrations. With the conventional $Eu^{2+}$ doped β-Sialon, however, the following problem remains unsolved: if its composition and the amount of Eu to be added are adjusted, luminescence intensity reaches the maximum when the peak fluorescence wavelength falls within the range from 540 to 545 nm, and if the peak fluorescence wavelength falls outside this range, the luminescence intensity shows a steep decline (Non-patent Literature 2).

SUMMARY OF THE INVENTION

In applying $Eu^{2+}$ doped β-Sialon for light-emitting devices such as white LED, a technique of adjusting luminescence wavelength while maintaining luminous efficiency is desired.

The inventors have confirmed that the peak fluorescence wavelength of the $Eu^{2+}$ doped β-Sialon increases by increasing the z value in general formula of β-Sialon host, $Si_{6-z}Al_zO_zN_{8-z}$, namely by increasing the ratio of $Al_2O_3$ in raw material. Meanwhile, it was also found that if the ratio of $Al_2O_3$ is increased, the amount of crystalline phase of materials other than β-Sialon increases and significant sintering progresses among particles and therefore excessive crashing becomes necessary to obtain powder, and that deviation of composition ratio degrades fluorescence property markedly.

The inventors found that by adding β-Sialon to a raw material in advance and heating to manufacture $Eu^{2+}$ doped β-Sialon, obtained β-Sialon ensuring longer wavelength luminescence than before while maintaining high luminous efficiency can be obtained even if the ratio of $Al_2O_3$ is increased, and thus developed the present invention. Hereinafter in this description, the β-Sialon to be added to raw materials is referred to as "β-Sialon for addition." If the raw materials, to which β-Sialon for addition is added, are heated, preferential grain growth is assumed to occur with the β-Sialon for addition used as nucleus, thereby suppressing sintering among particles and producing β-Sialon that ensures long-wavelength luminescence.

One of the objectives of the present invention is to provide β-Sialon that is excited by light in a wide wavelength range from ultraviolet to visible light and efficiently emits green-to-yellow visible light. Another objective of the present invention is to provide a method of producing β-Sialon having excellent emission property as described above. Yet other objective of the present invention is to provide a light-emitting device that uses the above-described β-Sialon as phosphor.

The present invention provides β-Sialon with $Eu^{2+}$ contained in β-Sialon host crystal expressed as $Si_{6-z}Al_zO_zN_{8-z}$ (0.3≤z≤1.5) in a form of solid solution as light emission center, wherein the peak wavelength of fluorescent spectrum obtained when excited by light having wavelength of 450 nm is from 545 nm to 560 nm, half-value breadth is 55 nm or longer, and external quantum efficiency is 45% or higher. Hereinafter, the $Eu^{2+}$ doped β-Sialon will be simply referred to as "β-Sialon."

With the β-Sialon of the present invention, it is desirable that the crystal lattice constant a is from 0.7614 to 0.7645 nm, and that crystal lattice constant c is from 0.2914 to 0.2940 nm. As elemental components, it is desirable that Al is contained in from 2.5 to 12 mass weight %, Eu in 0.15 to 1%, and oxygen in 1.4 to 5.5 mass weight %.

To achieve one of the objectives of the present invention, the diffraction line intensity found by the assessment of powder X-ray diffractometry of the crystalline phases other than the β-Sialon preferably accounts for 8% or less of the diffraction line intensity of 101 surface of the β-Sialon. In addition, in particle size distribution of the β-Sialon of the present invention measured by laser diffraction scattering method, it is desirable that 50% diameter (D50) in integrated volume fraction is from 7 μm to 30 μm, 10% diameter (D10) is 4 μm or larger, and the specific surface area is from 0.05 $m^2$/g to 0.4 $m^2$/g. More preferably, the average short axis value is from 7 to 30 μm. Here, the average short axis value represents the average value of the length of short sides of a rectangle circumscribing particles, which can be measured using particle/shape distribution measuring instrument (such as PITA-1 by Seishin Enterprise Co., Ltd.)

To achieve the above another objectives, the present invention provides a method of producing $Eu^{2+}$ doped β-Sialon, which contains $Eu^{2+}$ in β-Sialon host crystal expressed as $Si_{6-z}Al_zO_zN_{8-z}$ in a form of solid solution as light emission center, including; a heating process wherein oxide of one or more types selected from aluminum oxide and silicon oxide, silicon nitride, and aluminum nitride are mixed in order that z value becomes 0.3 to 1.5, europium oxide or europium salt that turns to be europium oxide by heating and β-Sialon for addition having the average particle size of 5 μm or larger and the average degree of circularity of 0.7 or higher are further added within a range from 5% to 30% by mass, and the mixture is heated in nitrogen atmosphere; a process of crashing the obtained sintered body to obtain crashed sintered body; a heating process wherein the crashed sintered body is heated in a noble gas atmosphere or in vacuum; and an acid treatment process wherein heated body is oxidized.

In the method of producing β-Sialon described above, it is desirable that the percentage of the oxide of one or more types selected from aluminum oxide and silicon oxide is from 2.2% to 20% by mass.

To achieve other objective, the present invention provides a light-emitting device using the above β-Sialon as phosphor, and preferably using an LED as a light source for exciting the phosphor.

The β-Sialon of the present invention is excited within a wide wavelength range covering ultraviolet light to visible light, thereby efficiently emitting green to yellow visible light. In addition, with the β-Sialon of the present invention, fluorescence wavelength can be adjusted while high luminous efficiency is maintained, which allows the use for various light-emitting devices, including white LED using ultraviolet LED chips or blue LED chips, by itself or in combination with other phosphors. Furthermore, by using the method of producing the β-Sialon of the present invention, β-Sialon having excellent emission property as described above can be produced.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

The present invention will hereinafter be described in detail by referring to embodiments.

The β-Sialon of the present invention is $Eu^{2+}$ doped β-Sialon, which contains $Eu^{2+}$ in β-Sialon host crystal expressed as $Si_6Al_zO_zN_{8-z}$ ($0.3 \leq z \leq 1.5$), in a form of solid solution as light emission center, wherein the peak wavelength of fluorescent spectrum obtained when excited by light having wavelength of 450 nm is from 545 nm to 560 nm, the half-value breadth is 55 nm greater, and external quantum efficiency is 45% or higher.

The β-Sialon host crystal is in a state where Al replaces the position of Si, and N replaces the position of O, of β-type silicon nitride, as solid solutions, and is given by general formula $Si_{6-z}Al_zO_zN_{8-z}$ because there exist two formula-weight atoms in a unit cell. The parameter z falls within the range from 0 to 4.2, meaning that the range of state of solid solution is very large, and it is necessary to maintain molar ratio (Si, Al)/(N, O) at ¾. Therefore, as raw materials, in addition to $Si_3N_4$, $SiO_2$ and AlN, or $Al_2O_3$ and AlN are added and heated to produce the β-Sialon host crystal.

When powder raw material mixture. $Si_3N_4$—$SiO_2$—AlN—$Al_2O_3$—$Eu_2O_3$, is heated at high temperature to produce β-Sialon, with the increase in z value, the peak fluorescence wavelength shifts to longer wavelength side, and the half-value breadth of the fluorescent spectra increases. However, it was also found that with the β-Sialon obtained by conventional manufacturing method, high luminescence intensity can be obtained only within a limited z value range (z=about 0.25) because luminescence intensity changes significantly if z value is changed.

With the increase in z value, a large amount of liquid phase mainly consisting of oxide is generated during the heating process, promoting interparticle sintering, and at the same time, a large amount of liquid phase is not allowed to change into the β-Sialon, and consequently remains in grain boundary, etc. as a heterophase, and because of the following reasons, the luminescence intensity is considered to decrease significantly:

(1) The amount of $Eu^{2+}$ contained in β-Sialon crystal as solid solution decreases because Eu is taken into the heterophase generated during the heating process, and (2) Excessive crashing is required in the powdering process of the sintered body, allowing defects to occur in the β-Sialon crystal, and consequently emission intensity decreases significantly.

To solve the above problems, a manufacturing method to be described later wherein generation of a heterophase is suppressed as far as possible and interparticle sintering hardly occurs was studied, and thus the present invention has been completed.

With the β-Sialon of this embodiment, the peak wavelength of fluorescent spectra when excited by the light having wavelength of 450 nm is from 545 nm to 560 nm, the half-value breadth is 55 nm or greater, and the external quantum efficiency is 45% or higher. External quantum efficiency is the ratio of the number of fluorescence-emitting photons to the number of photons of the exciting light irradiated to the β-Sialon. If the external quantum efficiency is low, sufficient brightness cannot be obtained in light-emitting devices using the β-Sialon such as white LED, etc. which is undesirable. With the conventional $Eu^{2+}$ doped β-Sialon also, peak wavelength of 545 nm or longer and half-value breadth of 55 nm or greater had been obtained as fluorescence properties, but external quantum efficiency of 45% or higher had not been achieved, making it difficult to put it in practical use.

The parameter z of the β-Sialon of this embodiment falls within the range from 0.3 to 1.5. If z value is smaller than 0.3, the peak fluorescence wavelength becomes shorter than 545 nm, whereas if z value exceeds 1.5, it becomes difficult to suppress generation of heterophases and interparticle sintering, and consequently luminescence intensity decreases.

β-Sialon is manufactured by heating mixture of raw powder of silicon, aluminum nitride, and oxide at high temperature. During the heating process, part of the raw material volatilizes and at the same time a Si—Al—O—N glass phase is produced inevitably as a by-product and depending on circumstances, heterophases such as AlN polytypoids and α-Sialon are generated. Consequently, it is difficult to find accurate z value by analyzing composition of raw materials and raw powder. Lattice constant is an index indicating accurate z value of β-Sialon. To obtain fluorescence properties of the β-Sialon of the present invention described above, it is desirable that the lattice constant a of the β-Sialon crystal fall within the range from 0.7614 to 0.7645 nm, and lattice constant c fall within the range from 0.2914 to 0.2940 nm. To achieve this, it is desirable that the Al content in the β-Sialon fall within the range from 2.5 to 1.2% by mass, Eu content within the range from 0.15 to 1% by mass, and oxygen content within the range from 1.4 to 5.5% by mass.

From the viewpoint of fluorescent emission, it is desirable that the β-Sialon contains as large amount of highly-pure β-Sialon host crystal phase as possible, contain β-Sialon host crystal phase only, if possible. However, a slight amount of inevitable noncrystal, or mixture containing other crystal phases, may be contained within a range where properties do not degrade. It is desirable that the diffraction line intensity of crystal phases different from the β-Sialon host crystal phase is 8% or lower of the diffraction line intensity of 101 surface of the β-Sialon when assessed by the powder X-ray diffractometry. Since single phase is preferable as crystal phases, the lower limit value of the diffraction line intensity is 0.

In particle size distribution of the β-Sialon of the present invention measured by laser diffraction scattering method, it is desirable that the 50% diameter (D50) in integrated volume fraction be 7 μm or larger, and 10% diameter (D10) be 4 m or larger, more preferably, from 4 μm to 30 μm. With particles of small particle size, the luminescence intensity of the β-Sialon itself is low due to the effect of defects of crystal, etc., and in addition the fluorescence wavelength comes closer to the wavelength of visible light, thereby scattering light. Consequently, if an LED is assembled using β-Sialon low in small-size particle content, significant scattering of light within a layer containing the β-Sialon can be suppressed, and the luminous efficiency of the LED, namely the efficiency of taking out light, increases.

Furthermore, it is desirable that D50 of the β-Sialon in this embodiment is 30 μm or smaller. By eliminating particles having large D50 value, uniform mixture into a resin for sealing the LED is facilitated, and at the same time the cause of fluctuation in chromaticity and color unevenness of the irradiated surface can be minimized.

It is desirable that in addition to the particle size described above, the specific surface area of the β-Sialon in this embodiment is from 0.05 $m^2/g$ to 0.4 $m^2/g$. The reason is that if the particle size is the same, particles consisting of single-crystal particles or those consisting of a small number of relatively large primary particles are preferable to the particles formed with a large number of small primary particles sintered therein because luminous efficiency is high. In addition, the more smooth the surface of the particles of the β-Sialon, the more light scattering on the surface of the particles is suppressed, which increases the efficiency of taking in excited light into the particles. In addition the adhesiveness of interface between β-Sialon particles and a sealing resin also increases. The size of the primary particles and the smoothness of the surface of the particles have significant correlation with the specific surface area, and from this perspective, it is desirable that the specific surface area fall within the range described above.

The shape of β-Sialon that is particle and tend to form a columnar shape, reflecting its crystalline structure. The degree of forming columns varies depending on the composition of raw materials, the composition of oxide contained in them, and/or heating conditions. Normally, β-Sialon is adjusted so that the particle size falls within the range described above by combining crashing process and classification process. Since columnar particles are susceptible to break in the direction perpendicular to the long axis, if columnar particles are crashed, their long axis becomes shorter, while the short axis remains as it is. Consequently, if crashing process and/or classification process are/is performed to allow particle distribution of β-Sialon having small short axis to fall within the range described above, the long side/short side ratio generally increases. Particles having made to be in a columnar shape to the utmost extent are not desirable because they decreases dispersibility into a resin for sealing LED or cause fluctuation in brightness or chromaticity of white LED using them.

The inventors conducted review and found that by allowing the average short axis to fall within the range from 7 to 30 μm, with the β-Sialon having the particle size distribution measured by the laser diffraction scattering method falling within the range described above, the problems of white LED described above can be resolved.

A method of producing the β-Sialon in this embodiment will be described.

The β-Sialon in this embodiment is obtained by heating mixed raw materials (hereinafter simply referred to as "mixed raw material") prepared by adding β-Sialon for addition to raw materials consisting of silicon oxide and/or aluminum oxide, silicon nitride, aluminum nitride, and Eu compound (hereinafter simply referred to as "β-Sialon raw material") at the temperature from 1800° C. to 2200° C. in the nitrogen atmosphere.

Specifically, to manufacture $Eu^{2+}$ doped β-Sialon, in which $Eu^{2+}$ is contained in the host crystal of β-Sialon shown as $Si_{6-z}Al_zO_zN_{8-z}$ as light emission center, oxide of one or more types selected from aluminum oxide and silicon oxide, silicon nitride, and aluminum nitride are mixed so that the z value becomes from 0.3 to 1.5, europium oxide or europium salt that turns to be europium oxide by heating and powder β-Sialon for addition having the average particle size of 5 μm or larger and the average degree of circularity of 0.7 or greater are further added from 5 to 30% by mass. This mixture is heated in nitrogen atmosphere to obtain sintered body. Then the obtained sintered body is crashed, and the crashed sintered body is heated in noble gas atmosphere or in vacuum to obtain heat-treated body. The obtained heat-treated body is subjected to acid treatment. The β-Sialon obtained in this way has the peak fluorescence wavelength having shifted to the long wavelength side, and has wide half-value breadth of fluorescent spectra and high reminiscence intensity.

In the initial stage of heating in nitrogen atmosphere, reaction progresses as follows: the oxide in the raw material forms a liquid phase, and $Si_3N_4$ and AlN dissolve in the liquid phase and precipitate as β-Sialon. Even after the most of β-Sialon raw material has turned β-Sialon, a trace amount of liquid phase remains, and as a result of small-particle β-Sialon having high dissolving rate dissolving into the liquid phase preferentially and re-precipitating on large-particle Sialon, coarse growth progresses. In other words, the difference in particle diameters of β-Sialon is the cause of coarse growth. The β-Sialon for addition added to the raw material mixture, which has particle size significantly larger than the β-Sialon formed from raw material in the initial stage of heating, grows as nucleus.

Adding powder β-Sialon for addition to β-Sialon raw material is effective to suppress interparticular sintering, which is problematic with the β-Sialon raw material having high oxide content and high z value. By suppressing interparticular sintering, excessive crashing becomes unnecessary to obtain β-Sialon having a given particle size, and generation of crystal defect causing degradation in fluorescence property can be suppressed.

Adding β-Sialon for addition to β-Sialon raw material has the effect of suppressing generation of heterophases, which are difficult to change into the β-Sialon crystal. To obtain the effect of suppressing generation of heterophases, size and shape of the β-Sialon for addition are important factors. In the present invention, it is desirable that the size and the shape of the β-Sialon for addition be as follows: average particle size; from 5 μm to 30 mm, and the average degree of circularity; from 0.7 to 1. If the average particle size is small, the particle size of the β-Sialon obtained after heating becomes small, hindering sufficient fluorescence property from being obtained, which is not desirable.

The average degree of circularity is the average value of circularity found by dividing the "perimeter of a circle having the same area as the particle area" divided by "perimeter of the particle," and can be measured using particle/shape distribution measuring instrument as in the case of the measurement of average short axis. When a plurality of sintered particles constitute secondary particles, or when aspect ratio is high, the average degree of circularity becomes smaller than 0.7. If powder β-Sialon whose average degree of circularity is smaller than 0.7 is added to β-Sialon raw material in advance, state, size, and composition of β-Sialon particles become non-uniform, which is undesirable.

Since particle growth of β-Sialon occurs preferentially in the direction of the long axis of primary particles (near-monocrystal particles), β-Sialon for addition formed with large monocrystal particles is preferable to that formed with a plurality of small primary particles sintered to form secondary particles, and smaller particle aspect ratio (value found by dividing the long axis by short axis) is preferable.

It is preferable that the amount of β-Sialon for addition be added by 5 to 30% by mass. If the amount is too small, growth and sintering of new β-Sialon particles other than the β-Sialon for addition and particle growth progress, which is undesirable. If the amount is too large, factors for particle growth increases, hampering the growth of particles, and consequently the intended effect of adding the β-Sialon for addition cannot be obtained, which is undesirable.

The constituent elements and compositions of the β-Sialon for addition are not restricted because the fluorescence property of the β-Sialon develops in regions close to the surface of the powder, in excitation of ultraviolet light to blue light. However, if the β-Sialon for addition containing different light emission center elements or impure elements hampering luminescence such as iron is used, the property of the β-Sialon layer formed on its surface is affected largely, which is undesirable.

The raw material mixture containing β-Sialon for addition can be obtained by the method of dry mixing, the method of wet-mixing in an inert solvent that virtually does not react with each raw material component and then removing the solvent, etc. As mixing devices, V-type mixer, rocking mixer, ball mill, oscillating mill, etc. can be used preferably.

By filling raw material mixture containing β-Sialon for addition in a container made of a material that does not react with the raw material mixture during the heating process, boron nitride for example, and heating in the nitrogen atmosphere, solid solution reaction progresses and β-Sialon can be obtained. The heating temperature range is preferably from 1800 to 1950° C. If the heating temperature is low, β-Sialon particle growth does not progress smoothly, and thus sufficient fluorescence property cannot be obtained. If the heating temperature is high, the amount of crystal defects generated during the process of particle growth increases and absorbs visible light, thereby degrading fluorescence property.

The particulate or massive sintered body obtained by heat treatment is shredded, crashed, and/or made to be β-Sialon of a given size in combination with classification operation. To use the β-Sialon suitably as phosphor for LED, it is desirable that D10 and D50 fall within a given range as described above.

Specific treatment examples include the method of subjecting the sintered body to classification treatment using a sieve of the size of 20 to 45 to obtain powder having passed the sieve, and the method of crashing the sintered body using general crashers such as ball mill, oscillating mill, and jet mill to obtain given particle size. With the latter method, excessive crashing not only generates fine particles, which scatter light easily, but also degrades the luminous efficiency of the β-Sialon. According to the review by the inventors, the β-Sialon obtained by classification treatment using a sieve without performing crashing treatment, and by shredding treatment using a jet mill crasher ultimately exhibited high luminous efficiency.

The luminous efficiency of the β-Sialon obtained by the above methods further increases by performing the following treatment.

By subjecting the β-Sialon to heat treatment in noble gas atmosphere or in vacuum, luminescence inhibitors present in the β-Sialon is changed into state soluble in acid, and then subjected to acid treatment. Luminescence inhibitors include crystal defects and hetero-phases, which inhibit luminescence of visible light.

If the β-Sialon having undergone heat treatment in noble gas atmosphere is subjected to acid treatment, the luminescence inhibitor having been changed due to heating is dissolved and removed, and thus fluorescence property improves. As acids used for acid treatment, one or more types of acids selected from hydrofluoric acid, sulfuric acid, phosphoric acid, hydrochloric acid, and nitric acid is/are used, and a solution containing these acids is used. Acid treatment is conducted by mixing the β-Sialon having undergone the heat treatment described above in the solution containing acids described above, and agitating the solution for several minutes to several hours to cause reaction. After the acid treatment, β-Sialon particles and acids are separated using a filter, etc., and then the β-Sialon particles are washed thoroughly with water.

The method of producing β-Sialon of the present invention is applicable to a wide z value range, but it is desirable from the viewpoint of prevention of sintering at the time of heating that the z value is from 0.3 to 1.5, which is higher than conventionally known z value. Specifically, the producing method is effective when the oxide content of the starting material excluding β-Sialon for addition is from 2.2% to 20% by mass.

The present invention will hereinafter be described in detail by referring to Examples, and comparing with Comparative Examples.

Example 1

Manufacture of Sialon for Addition 95.43 mass % α-type silicon nitride powder (grade SN-E10, Ube Industries, Ltd., oxygen content: 1.0 mass %), 3.04 mass % aluminum nitride powder (grade F, Tokuyama Corporation, oxygen content: 0.8 mass %), 0.74 mass % aluminum oxide powder (grade TM-DAR, Taimei Chemical Co., Ltd.), and 0.79 mass % europium oxide powder (grade RU, Shin-Etsu Chemical Co., Ltd.) were mixed using a V-type mixer ("S-3," Tsutsui Scientific Instruments Co., Ltd.), and the mixture was then sieved with a 250 μm sieve completely to remove agglomerate and obtain β-Sialon raw material. The compounding ratio was designed to achieve z=0.25 excluding europium oxide in general β-Sialon formula, $Si_{6-z}Al_zO_zN_{8-z}$.

The β-Sialon raw material was filled in a lidded cylindrical container made of boron nitride (grade N-1, Denki Kagaku Kogyo Kabushiki Kaisha), and heat treatment was performed in a carbon-heater electric furnace in pressurized nitrogen atmosphere of 0.8 MPa at 2000° C. for 15 hours. The obtained sintered body was in a slightly coagulated state of mass that can be broken by hand. After performing mild shredding, the following operations were conducted to manufacture three types of β-Sialon for addition having different particle sizes and shapes.

The sintered body having undergone mild shredding was shredded using a supersonic jet crasher (PJM-80SP, Nippon Pneumatic Mfg. Co., Ltd.). The shredding conditions were as follows: sample supply rate: 50 g/min., and crashing air pressure: 0.3 MPa. The powder obtained by shredding was subjected to classification treatment using an air sifter (Classiel N2.5, Seishin Enterprise Co., Ltd.) The classification conditions were as follows: sample supply rate: 50 g/min, classification air flow rate: 4.0 m/m³, and number of revolutions: 2000 rpm. The coarse powder collected by this classification operation was named β-Sialon for addition A, and the fine powder was named β-Sialon for addition B.

β-Sialon C for addition was obtained by sieving the sintered body using a 45 μm shaking sieve without subjecting it to shredding treatment using the ultrasonic jet crasher.

The three types of β-Sialon for addition A, B, and C obtained in a manner described above were subjected to powder X-ray diffractometry (XRD) using Cu—Kα ray and an X-ray diffractometer (ULTIMA IV, Rigaku Corporation), and β-Sialon host only was found to exist as a crystalline phase.

Then, using a particle distribution measuring instrument (LS-230, Beckman Coulter), particle diameter distribution measurement was conducted by the laser diffraction/scattering method. Samples for particle diameter distribution measurement were prepared under the silicon nitride measurement conditions listed in Table 1 with interpretation of JIS R 1629-1977 in principle.

The average degree of circularity of the β-Sialon for addition was measured using a particle/shape distribution measuring instrument (PITA-1) manufactured by Seishin Enterprise Co., Ltd. Samples for measurement were dispersed by ultrasonic dispersion in a 0.5 mass % hexametaphosphoric acid solution to prepare sample solutions. Distilled water was used as solvent for measurement, and a CCD camera for taking images was used with its objective lens set at magnification of 10. Of the pieces of circularity data obtained, the average value of approximately 5000 pieces that exhibited circle-equivalent diameter of 2.5 μm or larger was found. Table 1 lists the average particle diameter and average degree of circularity of the β-Sialon for addition.

TABLE 1

|  | Average particle diameter (μm) | Average degree of circularity |
|---|---|---|
| Sialon for addition A | 15.8 | 0.74 |
| Sialon for addition B | 10.1 | 0.73 |
| Sialon for addition C | 24.1 | 0.57 |

<Manufacture of β-Sialon>

75.37 mass % α-type silicon nitride powder (grade SN-E10, Ube Industries, Ltd., oxygen content: 1.0 mass %), 4.32 mass % aluminum nitride powder (grade F, Tokuyama Corporation, oxygen content: 0.8 mass %), 4.60 mass % aluminum oxide powder (grade TM-DAR, Taimei Chemical Co., Ltd.), 0.71 mass % europium oxide powder (grade RU, Shin-Etsu Chemical Co., Ltd.), and 15 mass % β-Sialon for addition A were mixed using a V-type mixer ("S-3," Tsutsui Scientific Instruments Co., Ltd.), and the mixture was then sieved with a 250 sieve thoroughly to remove agglomerate and obtain raw material mixture. The compounding ratio was designed to achieve z=0.65 excluding europium oxide and β-Sialon for addition in general β-Sialon formula, $Si_{6-z}Al_zO_zN_{8-z}$.

The obtained raw material mixture was filled in a lidded cylindrical container made of boron nitride, and heat treatment was performed using a carbon heater electric furnace in pressurized nitrogen atmosphere of 0.8 MPa at 1900° C. for 15 hours. The obtained sintered body was in a state of lightly coagulated mass. After shredding, the sintered body was further shredded using a supersonic jet crasher at the sample supply rate of 50 g/min. and crashing air pressure of 0.5 MPa, and then classification was performed using an air sifter, thereby removing fine powder and adjusting particularity distribution (coarse powder was collected). Classification conditions were as follows: sample supply rate: 50 g/min., classification air flow m rate: 2.0 m³, and number of revolutions: 2000 rpm.

Using an ultraviolet-visible spectrophotometer (V-550, JASCO Corporation) equipped with an integrating sphere unit, diffuse reflectance of the above powder was measured, and the average diffuse reflectance within the wavelength range of 650 to 800 nm was calculated to be 90.8%.

The powdered sintered body was filled in a lidded cylindrical container made of boron nitride, and heat treatment was conducted using a carbon heater electric furnace in the argon atmosphere at the atmospheric pressure of 1500° C. for 8 hours. The color of the obtained powder changed from green, the color exhibited before the treatment, to dark green. Then the powder was subjected to 1:1 mixed acid treatment using a 50% hydrofluoric acid solution and a 70% nitric acid solution. During the treatment, the suspension changed color from dark green to bright green. Filtering, washing, and drying were then conducted to obtain powder β-Sialon. The average diffuse reflectance within the wavelength range of 650 to 800 nm of the obtained powder was 95.9%, which was higher than the value found before heating in the argon atmosphere.

As a result of conducting XRD measurement of the obtained β-Sialon, the crystal phase was found to be single-phase β-Sialon. The obtained powder X-ray diffraction pattern was subjected to Rietveld analysis using the analysis program JADE by Rigaku Corporation, and the lattice constants a and c of the β-Sialon were respectively found to be 0.7622 nm and 0.2922 nm.

The Al content and Eu content were measured, after the powder was dissolved by the alkali fusion method, using an ICP emission spectrometric analyzer (CIROS-120, Rigaku Corporation). The oxygen content was measured using an oxygen-nitrogen analyzer (EMGA-920, Horiba Ltd.) The Al, Eu, and oxygen contents of this powder were respectively measured to be 4.7%, 0.4%, and 2.7% by mass.

As a result of conducting particle diameter distribution measurement by the laser diffraction scattering method using a particle size distribution measuring instrument, the 50% diameter (D50) and 10% diameter (D10) in the fraction of volumetric basis were respectively found to be 16.2 μm and 9.4 μm.

Under the same conditions as the degree of circularity measurement of the β-Sialon for addition, the short axis of the β-Sialon was measured. Approximately 5000 particles having circle-equivalent diameter of 2.5 μm were measured, and the average value of the short axes allowing the accumulated particle area to account for 50% of the total particle area was found. The average short axis value found in this way was 14.1 μm.

The specific surface area of the β-Sialon was measured by the constant-capacity gas absorption method using a specific surface area measuring instrument (BELSORP-mini) manufactured by BEL Japan Inc., and calculated by BET multi-point analysis. Samples for measurement were subjected to deaeration treatment in advance under $N_2$ flow at the atmospheric pressure at 305° C. for two hours or longer. Nitrogen was used as an adsorbate, and the cross-sectional area of the β-Sialon molecules was adjusted to become $16.2 \times 10^{-20}$ m$^2$. The specific surface area of the β-Sialon of Example 1 obtained in this way was 0.14 m$^2$/g.

The emission property of the β-Sialon was assessed by the following method. A recessed cell was filled with the β-Sialon in order that the surface of the cell became even, and an integrating sphere was mounted. To the integrating sphere, blue light dispersed from an emission source (Xe lamp) to have wavelength of 455 nm was introduced using optical fiber. The blue light was irradiated to the β-Sialon sample as an excitation source, and the spectra of the fluorescent light and the reflected light were measured using a spectrophotometer (MCPD-7000, Otsuka Electronics Co., Ltd.) From the fluorescence spectra, the peak wavelength and half-value breadth were found. The peak wavelength was 550 nm, and the half-value breadth was 60 nm.

The external quantum efficiency was found as follows. A standard reflector (SpectraIon, Labsphere, Inc.) having the reflectance of 99% was set to the sample unit, the spectrum of the excitation light dispersed to have wavelength of 455 nm was measured, and the number of photons of the excitation light (Qex) was calculated from the spectra within the wavelength range of 450 to 465 nm. Then the β-Sialon was set to the sample unit, the blue light dispersed to have wavelength of 455 nm was irradiated, and the number of photons of the excitation reflected light (Qref) and the number of photons of the fluorescent light (Qem) were calculated from the obtained spectrum data. The number of photons of the excitation reflected light was calculated within the same wavelength range as the number of photons of excitation light, whereas the number of photons of the fluorescent light was calculated within the range from 465 to 800 nm. The external quantum efficiency (=Qem/Qex×100), absorptance (=(Qex−Qref)× 100), and internal quantum efficiency (=Qem/(Qex−Qref)× 100) were found from the obtained three different numbers of photons. The absorptance, internal quantum efficiency, and external quantum efficiency of the β-Sialon of Example 1 were 69%, 81%, and 56% respectively.

Example 2

The β-Sialon in example 2 was manufactured using the same β-Sialon raw material as Example 1 by conducting the same treatment as Example 1 in order that the z value excluding europium oxide and the β-Sialon for addition became 0.35. The compounding ratio of the europium oxide in the β-Sialon raw material in Example 2 was the same as Example 1 for one mol of the β-Sialon expressed as $Si_{6-z}Al_zO_zN_{8-z}$ in outer percentage, and the inner percentage of the β-Sialon for addition was 15 mass %.

Example 3

The β-Sialon in example 3 was manufactured using the same β-Sialon raw material as Example 1 by conducting the same treatment as Example 1 in order that the z value excluding europium oxide and the β-Sialon for addition became 0.55. The compounding ratio of the europium oxide in the β-Sialon raw material in Example 3 was the same as Example 1 for one mol of the β-Sialon expressed as $Si_{6-z}Al_zO_zN_{8-z}$ in outer percentage, and the inner percentage of the β-Sialon for addition was 15 mass %.

Example 4

The β-Sialon in example 4 was manufactured using the same β-Sialon raw material as Example 1 by conducting the same treatment as Example 1 in order that the z value excluding europium oxide and the β-Sialon for addition became 0.8. The compounding ratio of the europium oxide in the β-Sialon raw material in Example 4 was the same as Example 1 for one mol of the β-Sialon expressed as $Si_{6-z}Al_zO_zN_{8-z}$ in outer percentage, and the inner percentage of the β-Sialon for addition was 15 mass %.

Example 5

The β-Sialon in example 5 was manufactured using the same β-Sialon raw material as Example 1 by conducting the same treatment as Example 1 in order that the z value excluding europium oxide and the β-Sialon for addition became 1.0. The compounding ratio of the europium oxide in the β-Sialon raw material in Example 5 was the same as Example 1 for one mol of the β-Sialon expressed as $Si_{6-z}Al_zO_zN_{8-z}$ in outer percentage, and the inner percentage of the β-Sialon for addition was 15 mass %.

Example 6

The β-Sialon in example 6 was manufactured using the same β-Sialon raw material as Example 1 by conducting the same treatment as Example 1 in order that the z value excluding europium oxide and the β-Sialon for addition became 1.5. The compounding ratio of the europium oxide in the β-Sialon raw material in Example 6 was the same as Example 1 for one mol of the β-Sialon expressed as $Si_{6-z}Al_zO_zN_{8-z}$ in outer percentage, and the inner percentage of the β-Sialon for addition was 15 mass %.

The β-Sialon in Comparative Examples was manufactured with z value set at 0.25 (Comparative Example 1) and 2.0 (Comparative Example 2) by conducting the same treatment as Example 1. The compounding ratio of the europium oxide in the β-Sialon raw material in Comparative Examples 1 and 2 was the same as Example 1 for one mol of the β-Sialon expressed as $Si_{6-z}Al_zO_zN_{8-z}$ in outer percentage, and the inner percentage of the β-Sialon for addition was 15 mass %.

Table 2 lists the compounding ratio of the β-Sialon raw material of Examples 1 to 6 and Comparative Examples 1 and 2. As described previously, the europium oxide remained constant in molar ratio, and the inner percentage of the β-Sialon for addition was 15 mass %.

TABLE 2

| | Z value | Mixing composition (% in mass) | | | | |
| --- | --- | --- | --- | --- | --- | --- |
| | | $Si_3N_4$ | AlN | $Al_2O_3$ | $Eu_2O_3$ | Sialon for addition A |
| Ex. 1 | 0.65 | 75.37 | 4.32 | 4.60 | 0.71 | 15.00 |
| Ex. 2 | 0.35 | 79.71 | 3.16 | 1.45 | 0.68 | 15.00 |
| Ex. 3 | 0.55 | 76.82 | 3.94 | 3.55 | 0.70 | 15.00 |
| Ex. 4 | 0.8 | 73.21 | 4.90 | 6.17 | 0.72 | 15.00 |
| Ex. 5 | 1.0 | 70.33 | 5.67 | 8.26 | 0.74 | 15.00 |
| Ex. 6 | 1.5 | 63.15 | 7.59 | 13.47 | 0.79 | 15.00 |
| Com. Ex. 1 | 0.25 | 81.16 | 2.78 | 0.39 | 0.68 | 15.00 |
| Com. Ex. 2 | 2.0 | 56.25 | 9.36 | 18.93 | 0.47 | 15.00 |

Table 3 and Table 4 list the measurement results of design z value in Examples 1 to 6 and Comparative Examples 1 and 2. The heterophase value in Table 3 is the percentage of the maximum diffraction line intensity of crystalline phase other than β-Sialon with respect to the diffraction line intensity of 101 surface of the β-Sialon crystal, and "No" was entered when there was no heterophase.

material. These composition changes are considered to have occurred due to volatilization of a part of the raw material that occurred in the heating process in nitrogen atmosphere, or because the phase that remained insoluble into the β-Sialon crystal was removed by annealing and acid treatment performed later.

Regarding fluorescence property, with the increase in z value of the raw material, the peak fluorescence wavelength shifted to longer wavelength side, and the spectral half-value breadth of spectra increased. The half-value breadth in Examples 1 to 6 was from 56 to 71 nm. The absorptance changes in accordance with the change in the raw material Eu content in the β-Sialon. Namely, if z value of raw material exceeded 1.5, the Eu content lowered rapidly, thus decreasing absorptance. Internal quantum efficiency exhibited as high as around 80% over a wide z value range, but when z=2, decreased significantly due to generation of a heterophase and decrease in crystallinity of the β-Sialon.

Table 4 indicates that in Comparative Examples 1 and 2 where z value fell outside the 0.3 to 1.5 range, the peak wavelength of the fluorescent spectra excited by the light having wavelength of 450 nm was shorter than 545 nm, or

TABLE 3

| | Design z value | X-ray diffraction | | | Composition analysis value (% in mass) | | | Particle size distribution (μm) | | Av. rectangular short side (μm) | Specific surface ($m^2$/g) |
| --- | --- | --- | --- | --- | --- | --- | --- | --- | --- | --- | --- |
| | | β-Sialon lattice constant a (nm) | β-Sialon lattice constant c (Å) | Hetero phase value | Al | Eu | Oxygen | D50 | D10 | | |
| Ex. 1 | 0.65 | 0.7622 | 0.2922 | No | 4.69 | 0.38 | 2.74 | 16.2 | 9.4 | 14.1 | 0.14 |
| Ex. 2 | 0.35 | 0.7615 | 0.2915 | No | 2.77 | 0.45 | 1.53 | 16.3 | 9.7 | 13.7 | 0.12 |
| Ex. 3 | 0.55 | 0.7620 | 0.2920 | No | 4.20 | 0.42 | 2.29 | 16.3 | 8.9 | 13.5 | 0.17 |
| Ex. 4 | 0.8 | 0.7626 | 0.2924 | No | 5.72 | 0.34 | 3.19 | 17.2 | 9.3 | 14.1 | 0.16 |
| Ex. 5 | 1 | 0.7629 | 0.2928 | No | 7.24 | 0.34 | 3.78 | 16.8 | 9.4 | 14.0 | 0.18 |
| Ex. 6 | 1.5 | 0.7641 | 0.2938 | 1.8 | 11.65 | 0.20 | 5.16 | 16.5 | 9.5 | 14.6 | 0.21 |
| Com. Ex. 1 | 0.25 | 0.7612 | 0.2913 | No | 2.01 | 0.44 | 1.13 | 19.3 | 12.1 | 16.7 | 0.16 |
| Com. Ex. 2 | 2 | 0.7654 | 0.2951 | 10.5 | 15.12 | 0.13 | 6.93 | 14.5 | 7.9 | 12.1 | 0.42 |

TABLE 4

| | Design z value | Fluorescence spectra | | Absorptance (%) | Internal quantum efficiency (%) | External quantum efficiency (%) |
| --- | --- | --- | --- | --- | --- | --- |
| | | Peak wavelength (nm) | Half-value breadth (nm) | | | |
| Ex. 1 | 0.65 | 550 | 60 | 69 | 81 | 56 |
| Ex. 2 | 0.35 | 546 | 56 | 72 | 78 | 56 |
| Ex. 3 | 0.55 | 549 | 59 | 71 | 81 | 58 |
| Ex. 4 | 0.8 | 550 | 61 | 71 | 82 | 58 |
| Ex. 5 | 1 | 553 | 64 | 68 | 82 | 56 |
| Ex. 6 | 1.5 | 555 | 71 | 56 | 86 | 48 |
| Com. Ex. 1 | 0.25 | 544 | 55 | 75 | 76 | 57 |
| Com. Ex. 2 | 2 | 557 | 76 | 50 | 68 | 34 |

With the increase in z value, the length of both a-axis and c-axis increased. It was confirmed by the XRD measurement that if z value exceeded 1, a crystalline phase other than β-Sialon was generated as a byproduct. The maximum diffraction line intensity of this heterophase accounted for 1.9% of the diffraction line intensity of 101 surface of the β-Sialon in Example 6, and 10.5% in Comparative Example 2. The composition analysis values indicate that the Eu content tended to decrease with the increase of z value of the raw external quantum efficiency was lower than 45%. Meanwhile, the external quantum efficiency in Examples 1 to 6 fell within the range from 48% to 58%.

Example 7

Figure 1:
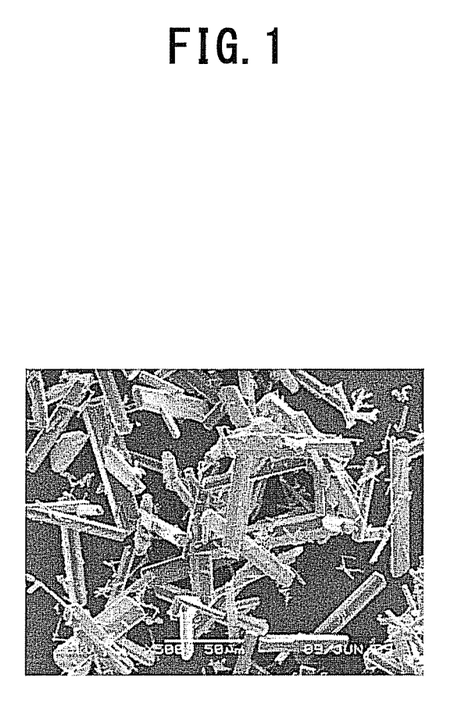
FIG. 1 is a scanning electron microscopic (SEM) image of a microstructure of Example 7 according to the present invention.

In Example 7, using the same β-Sialon raw material as Example 1, mixture was made in order that z value excluding europium oxide and β-Sialon for addition became 0.45. Mixing and heating in nitrogen atmosphere were conducted under the same conditions as Example 1, and samples after heating in nitrogen atmosphere were observed under a scanning electron microscope (SEM). FIG. 1 is an SEM image of Example 7.

Example 8

Figure 2:
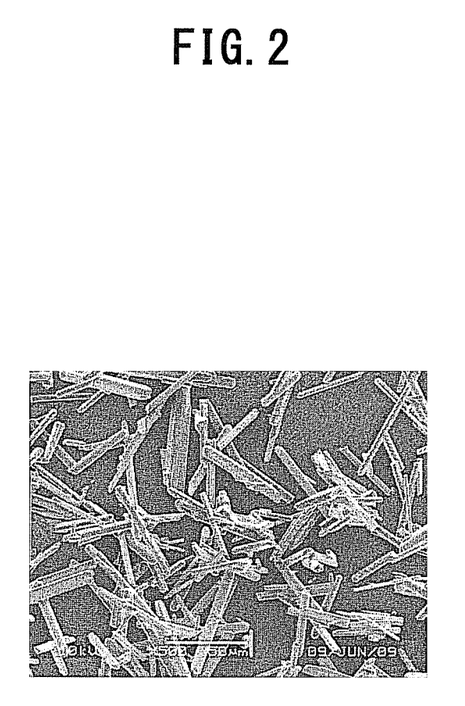
FIG. 2 is a scanning electron microscopic (SEM) image of a microstructure of Example 8 according to the present invention.

In Example 8, using the β-Sialon for addition B, mixing and heating in nitrogen atmosphere were performed under the same conditions as Example 7. The samples after heating in nitrogen atmosphere were observed under the SEM. FIG. 2 is an SEM image of Example 8.

Figure 3:
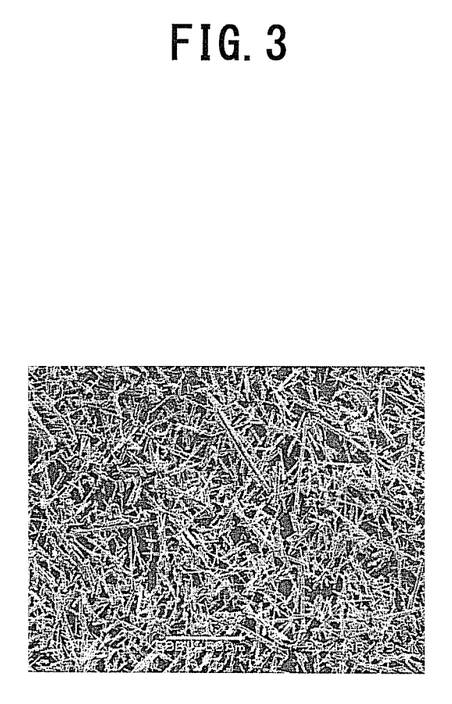
FIG. 3 is a scanning electron microscopic (SEM) image of a microstructure of Comparative Example 3.
Figure 4:
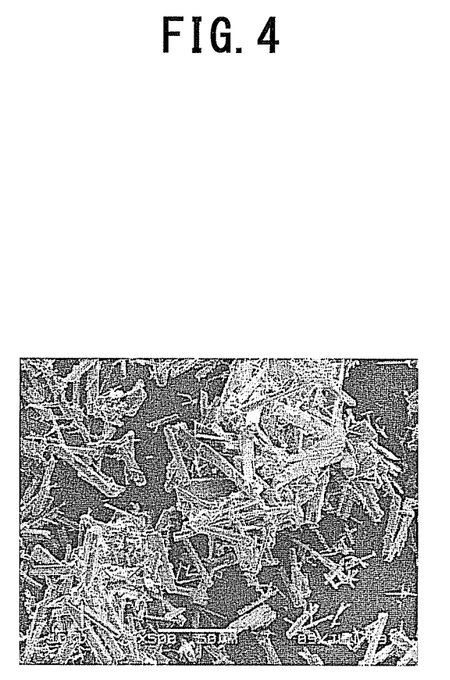
FIG. 4 is a scanning electron microscopic (SEM) image of a microstructure of Comparative Example 4.

In Comparative Example 3, β-Sialon for addition was not added, whereas in Comparative Example 4, Sialon for addition C was used, and heating in nitrogen atmosphere was performed for both at the same composition and under the same conditions as Example 7. FIG. 3 is an SEM image of Comparative Example 3, and FIG. 4 is an SEM image of Comparative Example 4.

Table 5 lists the raw materials for the β-Sialon and β-Sialon for addition used in Examples 7 and 8 and Comparative Examples 3 and 4.

TABLE 5

| | Z value | Sialon for addition | Mixing composition (mass %) | | | | Raw material Sialon |
|---|---|---|---|---|---|---|---|
| | | | $Si_3N_4$ | AlN | $Al_2O_3$ | $Eu_2O_3$ | |
| Ex. 7 | 0.45 | A | 78.26 | 3.55 | 2.50 | 0.69 | 15 |
| Ex. 8 | 0.45 | B | 78.26 | 3.55 | 2.50 | 0.69 | 15 |
| Com. Ex. 3 | 0.45 | — | 92.07 | 4.12 | 2.94 | 0.81 | 0 |
| Com. Ex. 4 | 0.45 | C | 78.26 | 3.55 | 2.50 | 0.69 | 15 |

As shown in FIGS. 1 to 4, the microstructure of the β-Sialon varies greatly depending on the type of β-Sialon for addition. In Comparative Example 3 where β-Sialon for addition was not contained, particle size was apparently small, and Comparative Example 4, where β-Sialon for addition C having small degree of circularity was used, exhibited microstructure where large and small particles existed in mixed state. In Examples 7 and 8 where the shape and size of β-Sialon for addition were controlled, microstructure formed with uniform-size columnar particles was obtained.

It is apparent that by forming uniform-size β-Sialon particles having short axis that is relatively long in the heating process, β-Sialon made of uniform particle-size columnar particles can be obtained.

Each β-Sialon in Examples 7, 8 and Comparative Example 4 was shredded using a jet mill under the same conditions as Example 1, except that particle adjustment by air shifting was not conducted. The obtained sample was subjected to annealing treatment in the Ar atmosphere and acid treatment as in the case of Example 1 to assess the fluorescence property. In Comparative Example 3, since it was not possible, as described above, to conduct crashing/classification treatment similar to the one conducted in other Examples and Comparative Examples, β-Sialon was crashed using a high-speed stamping mill (ANS-143PL, Nitto Kagaku Co., Ltd., Mortar and hammer: made of aluminum) until the entire volume passed through a 1 mm sieve, those having passed a 150 μm sieve were used as samples, and annealing and acid treatment were conducted in the Ar atmosphere as in the case of Example 1 to assess the fluorescence property. Tables 6 and 7 summarize the results of the assessment.

TABLE 6

| | Sialon for addition | X-ray diffraction | | | Composition analysis value (% in mass) | | | Particle size distribution (μm) | | Av. rectangular short side (μm) | Specific surface ($m^2$/g) |
|---|---|---|---|---|---|---|---|---|---|---|---|
| | | β-Sialon lattice constant a (Å) | β-Sialon lattice constant c (Å) | Hetero phase value* | Al | Eu | Oxygen | D50 | D10 | | |
| Ex. 7 | A | 0.7616 | 0.2917 | No | 3.33 | 0.48 | 1.95 | 11.9 | 5.3 | 8.7 | 0.29 |
| Ex. 8 | B | 0.7617 | 0.2917 | No | 3.41 | 0.52 | 2.01 | 9.3 | 4.3 | 7.8 | 0.33 |
| Com. Ex. 3 | — | 0.7616 | 0.2917 | No | 3.25 | 0.45 | 1.88 | — | — | — | 0.92 |
| Com. Ex. 4 | C | 0.7617 | 0.2917 | No | 3.40 | 0.50 | 1.98 | 8.5 | 3.2 | 6.8 | 0.43 |

TABLE 7

| | Sialon for addition | Fluorescence spectra | | Absorptance (%) | Internal quantum efficiency (%) | External quantum efficiency (%) |
|---|---|---|---|---|---|---|
| | | Peak wavelength (nm) | Half-value breadth (nm) | | | |
| Ex. 7 | A | 548 | 57 | 67 | 74 | 50 |
| Ex. 8 | B | 548 | 57 | 63 | 72 | 45 |
| Com. Ex. 3 | — | 550 | 56 | 45 | 70 | 32 |
| Com. Ex. 4 | C | 548 | 59 | 60 | 70 | 42 |

The external quantum efficiency was 45% or higher in Examples 7 and 8, whereas in Comparative Example 3 and Comparative Example 4, the external quantum efficiency was lower than 45%, a level unworthy of adopting.

Since the β-Sialon of the present invention is excited by light in wide wavelength range from ultraviolet to blue, and emits high-intensity light in green to yellow, it can be used preferably as phosphor for white LED using blue or ultraviolet light as a light source. Furthermore, since the brightness of the β-Sialon of the present invention does not decrease much at high temperature, and in addition since it has excellent resistance to heat and humidity, the brightness and luminescent colors of the illuminating devices using the above β-Sialon change little due to the change in the temperature of usage environment, and thus excellent property including long-term stability can be provided.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of producing β-Sialon that contains $Eu^{2+}$ in a β-Sialon host crystal expressed as $Si_{6-z}Al_zO_zN_{8-z}$ ($0.3 \leq z \leq 1.5$) and as a light emission center, the method comprising:

mixing one or more types of oxide selected from aluminum oxide and silicon oxide; silicon nitride; aluminum nitride; europium oxide or europium salt that turns to be europium oxide by heating; and a β-Sialon seed to obtain a β-Sialon mixed material, heating the β-Sialon mixed material in a nitrogen atmosphere to obtain a sintered body;

crushing the sintered body to obtain a crushed sintered body;

heating the crushed sintered body in a noble gas atmosphere or in vacuum to obtain a heated body; and treating the heated body by acid, wherein:

the β-Sialon seed has an average particle size of 5 μm or larger and an average degree of circularity of 0.7 to 1, a peak wavelength of a fluorescent spectrum is from 545 nm to 560 nm, the half-value breadth is 55 nm or greater, and the external quantum efficiency is 45% or higher when the β-Sialon seed is excited by light having a wavelength of 450 nm, and an amount of the β-Sialon seed is within a range from 5% to 30% by mass in the β-Sialon mixed material.

2. The method of producing the β-Sialon as set forth in claim 1, wherein the oxide is from 2.2% to 20% by mass.

* * * * *